(12) United States Patent
Takebayashi

(10) Patent No.: US 10,609,818 B2
(45) Date of Patent: Mar. 31, 2020

(54) INTEGRATED WIRING BOARD ASSEMBLY

(71) Applicant: NGK INSULATORS, LTD., Nagoya (JP)

(72) Inventor: Hiroshi Takebayashi, Handa (JP)

(73) Assignee: NGK Insulators, Ltd., Nagoya (JP)

( * ) Notice: Subject to any disclaimer, the term of this patent is extended or adjusted under 35 U.S.C. 154(b) by 440 days.

(21) Appl. No.: 15/642,768

(22) Filed: Jul. 6, 2017

(65) Prior Publication Data

US 2018/0020544 A1    Jan. 18, 2018

(30) Foreign Application Priority Data

Jul. 12, 2016 (JP) ................... 2016-137472

(51) Int. Cl.

| H05K 1/14 | (2006.01) |
|---|---|
| H01L 21/683 | (2006.01) |
| H01L 21/67 | (2006.01) |
| H05K 1/11 | (2006.01) |
| H05K 3/36 | (2006.01) |
| H05K 1/02 | (2006.01) |

(52) U.S. Cl.
CPC ....... *H05K 1/144* (2013.01); *H01L 21/67103* (2013.01); *H01L 21/67109* (2013.01); *H01L 21/6831* (2013.01); *H01L 21/6833* (2013.01); *H05K 1/118* (2013.01); *H05K 3/363* (2013.01); *H01L 21/67069* (2013.01); *H05K 1/028* (2013.01); *H05K 1/0209* (2013.01); *H05K 1/0212* (2013.01); *H05K 1/0215* (2013.01); *H05K 2201/041* (2013.01); *H05K 2201/09381* (2013.01)

(58) Field of Classification Search
CPC ........ H05K 1/144; H05K 1/118; H05K 3/363; H05K 1/0209; H05K 1/0212; H05K 1/0215; H05K 1/028; H05K 2201/041; H05K 2201/09381; H01L 21/67103; H01L 21/67109; H01L 21/6831; H01L 21/6833; H01L 21/67069
USPC ..... 219/132, 385, 530, 535, 536, 552, 468.1
See application file for complete search history.

(56) References Cited

U.S. PATENT DOCUMENTS

2016/0027678 A1* 1/2016 Parkhe ................ H01L 21/6833
279/128

FOREIGN PATENT DOCUMENTS

| JP | 05-090725 A1 | 4/1993 |
|---|---|---|
| JP | H06-326439 A1 | 11/1994 |
| JP | 2005-262752 A1 | 9/2005 |

OTHER PUBLICATIONS

Japanese Office Action (Application No. 2016-137472) dated Dec. 11, 2018 (with English translation).

* cited by examiner

*Primary Examiner* — Phuong T Nguyen
(74) *Attorney, Agent, or Firm* — Burr & Brown, PLLC

(57) ABSTRACT

A connection FPC 75 and a sheet heater 30 are joined together with a solder joint member interposed therebetween. The connection FPC 75 includes a ground contact point 90b and a connection electrode 90d extending along a row of contact points and to which the ground contact point 90b is connected. The connection electrode 90d extends beyond both ends of the row. The sheet heater 30 includes a ground land 46b and a connection land 46d extending along a row of lands and to which the ground land 46b is connected. The connection land 46d extends beyond both ends of the row.

8 Claims, 9 Drawing Sheets

INTEGRATED WIRING BOARD ASSEMBLY

BACKGROUND OF THE INVENTION

1. Field of the Invention

The present invention relates to an integrated wiring board assembly.

2. Description of the Related Art

Known examples of an integrated wiring board assembly including a flexible board and a printed hoard include a unit in which a contact point on a flexible board such as a contact point pattern is electrically connected to a corresponding contact point on a printed board by soldering (for example, PTL 1). FIG. 9 illustrates an example of such an integrated wiring board assembly. A flexible board 110 has a board end portion at which a cover lay film 112 is removed to expose end portions of a copper foil pattern arranged parallel at a uniform pitch so that the end portions serve as a contact point pattern 114. The contact point pattern 114 is superposed on a contact point pattern 124 formed on a printed board 120. Solder applied in advance to either one or both of the surfaces of the contact point pattern 114 and the contact point pattern 124 is melt to electrically connect the patterns to each other. The multiple contact points of the contact point pattern 114 are separate individual rectangular electrodes and arranged in a row in a predetermined direction. The multiple contact points of the contact point pattern 124 are formed and arranged similarly.

CITATION LIST

Patent Literature

PTL 1: JP 5-90725 A

SUMMARY OF THE INVENTION

However, the left and right side portions (see arrows in FIG. 9) of the flexible hoard 110 easily curl up. Thus, the contact points at the left and right ends of the contact point pattern 114 and the contact point pattern 124 are damaged and broken in some cases.

The present invention has been made to solve the above-described problem and mainly aims to improve bonding strength, of a first wiring board joined to a second wiring board and to maintain electrical connection between the first wiring board and the second wiring board even when the periphery of the first wiring board joined to the second wiring board curls up.

An integrated wiring board assembly according to the present invention includes a first wiring board, a second wiring board, and a joint member. The first wiring board includes a plurality of first contact points, exposed to an outside and arranged in a row in a predetermined direction, and a first connection electrode, extending along the row and to which one of the plurality of first contact points is connected, the first connection electrode extending beyond both ends of the row. The second wiring board is of a type the same as or different from a type of the first wiring board. The second wiring board includes a plurality of second contact points, exposed to the outside and arranged in a row in the predetermined direction, and a second connection electrode, extending along the row and to which one of the plurality of second contact points is connected, the second connection electrode extending beyond both ends of the row. The joint member is used for the first contact points of the first wiring board and the second contact points of the second wiring board to be brazed or soldered while the first contact points and the second contact points face one another and used for the first connection electrode of the first wiring board and the second connection electrode of the second wiring board to be brazed or soldered while the first connection electrode and the second connection electrode face each other.

In this integrated wiring board assembly, the plurality of first contact points of the first wiring board and the plural icy of second contact points of the second wiring board are brazed or soldered while the first contact points and the second contact points face one another and the first connection electrode of the first wiring board and the second connection electrode of the second wiring board are brazed or soldered while the first connection electrode and the second connection electrode face each other. Since the first connection electrode and the second connection electrode are brazed or soldered, the first wiring board joined to the second wiring board has higher bonding strength. Even if the periphery of the first wiring board joined to the second wiring board curls up, electrical connection between the first wiring board and the second wiring board is more likely to be maintained.

Here, soldering includes melting metals at temperatures of lower than 450° C. and brazing includes melting metals at temperatures of higher than or equal to 450° C.

In an integrated wiring board assembly according to the present invention, the first connection electrode may include first bent portions bent so as to surround two of the first contact points at both ends of the row, and the second connection electrode may include second bent portions bent so as to surround two of the second contact points at both ends of the row. This structure enhances the bonding strength of the first wiring board joined to the second wiring board. Even when the periphery of the first wiring board joined to the second wiring board curls up, electrical connection between the first wiring board and the second wiring board is more likely to be maintained.

In an integrated wiring board assembly according to the present invention, the first bent portions may extend to points aligned with ends of the first contact points at both ends of the row, and the second bent portions may extend to points aligned with ends of the second contact points at both ends of the row. This structure enhances the bonding strength of the first wiring board joined to the second wiring board. Even when the periphery of the first wiring board joined to the second wiring board curls up, electrical connection between the first wiring board and the second wiring board is more likely to be maintained. In such an integrated wiring board assembly according to the present invention, the second bent portions may extend beyond the points aligned with the ends of the second contact points at both ends of the row. In such an integrated wiring board assembly according to the present invention, each of the first bent portions may have a larger area than a first contact point adjacent to the first bent portion and each of the second bent portions may have a larger area than a second contact point adjacent to the second bent portion. This structure enhances bonding strength between the first bent portions and the second bent portions.

In an integrated wiring board assembly according to the present invention, the first contact point connected to the first connection electrode and the second contact point connected to the second connection electrode may serve as contact points of a circuit through which a strong current flows. The first contact point connected to the first connection electrode can be regarded as a single large contact point and the second contact point connected to the second connection electrode can also be regarded as a single large compact point. A junction between contact points in a circuit through which a strong current flows is likely to produce heat. Thus, using the large contact points as contact points of a circuit through which a strong current flows can reduce heat produced at the junction.

In an integrated wiring hoard assembly according to the present invention, an outer corner portion of the first connection electrode and an outer corner portion of the second connection electrode may be rounded. This structure disperses a stress, even when an external force is exerted on the connection electrodes, since these outer corner portions of the connection electrodes are rounded. Thus, electrical connection between the first connection electrode and the second connection electrode is more likely to be maintained. The term "rounded" includes the meaning of round shapes such as an arc and an ellipse arc.

In an integrated wiring board assembly according to the present invention, the first wiring board may be a flexible printed board. The second wiring board may be a sheet heater and disposed between an electrostatic chuck and a metal support pedestal. Since the flexible printed circuit board easily warps with external force, an application of the present invention is significant.

DETAILED DESCRIPTION OF THE INVENTION

Figure 1:
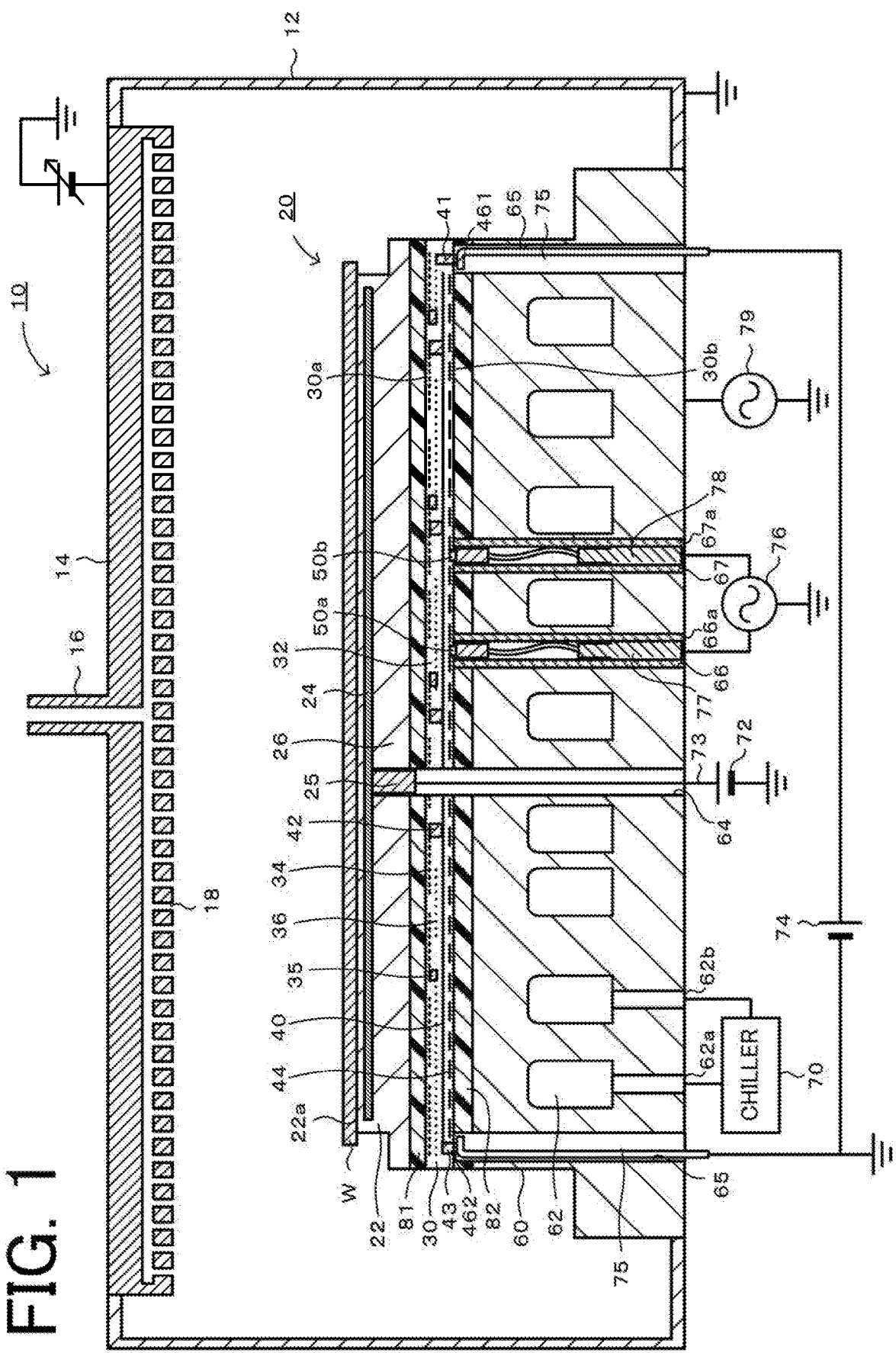
FIG. 1 is a sectional view of a schematic configuration of a plasma processor 10.
Figure 2:
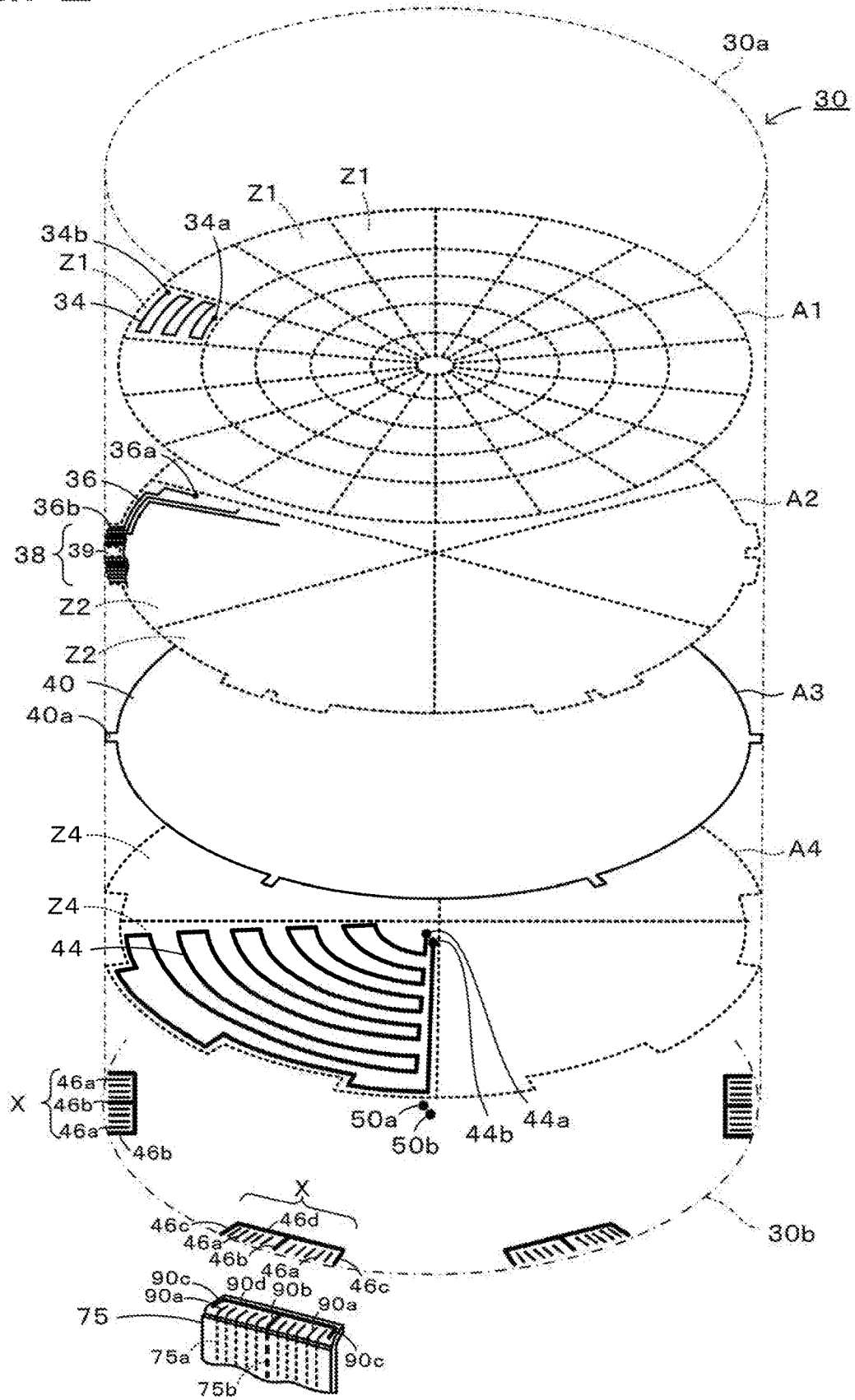
FIG. 2 is a perspective view of an internal structure of a sheet heater 30.

Preferable embodiments of the present invention are described below with reference to the drawings. FIG. 1 is a sectional view of a schematic configuration of a plasma processor 10 and FIG. 2 is a perspective view of an internal structure of a sheet heater 30.

As illustrated in FIG. 1, a plasma processor 10, which is a semiconductor manufacturing apparatus, includes a vacuum chamber 12, a showerhead 14, and an electrostatic chuck heater 20. The vacuum chamber 12 is a box-shaped container made of a material such as an aluminum alloy. The showerhead 14 is disposed on the ceiling of the vacuum chamber 12. The showerhead 14 discharges a process gas fed from a gas introduction pipe 16 through a large number of gas spraying holes 18 into the vacuum chamber 12. The showerhead 14 also serves as a cathode plate for producing plasma. The electrostatic chuck heater 20 is a device that sucks a wafer W and holds the wafer W on a wafer mount surface 22a. Now, the electrostatic chuck heater 20 is described in detail below.

The electrostatic chuck heater 20 includes an electrostatic chuck 22, a sheet heater 30, and a support pedestal 60. A lower surface of the electrostatic chuck 22 and an upper surface 30a of the sheet heater 30 are bonded together with a first bonding sheet 81 interposed therebetween. An upper surface of the support pedestal 60 and a lower surface 30b of the sheet heater 30 are bonded together with a second bonding sheet 82 interposed therebetween. Examples of each of the bonding sheets 81 and 82 include a sheet having acrylic resin layers on both surfaces of a polypropylene-made core, a sheet having silicone resin layers on both surfaces of a polyimide-made core, and a sheet simply made of an epoxy resin.

The electrostatic chuck 22 is a disc-shaped member and includes a ceramic sintered body 26 and an electrostatic electrode 24 buried in the ceramic sintered body 26. Examples usable as the ceramic sintered body 26 include an aluminum nitride sintered body and an alumina sintered body. The upper surface of the electrostatic chuck 22 serves as the wafer mount surface 22a on which the wafer W is mounted. The thickness of the ceramic sintered body 26 is not limited to a particular thickness but preferably falls within the range of 0.5 to 4 mm.

The sheet heater 30 is a disc-shaped member and includes a heat-resistant resin sheet 32 and correction heater electrodes 34, jumper wires 36, a ground electrode 40, and reference heater electrodes 44, which are installed in the heat-resistant resin sheet 32. Examples of the material of the resin sheet 32 include a polyimide resin and a liquid crystal polymer. The sheet heater 30 includes a first electrode region A1 to a fourth electrode region A4 (see FIG. 2), which are parallel to the upper surface 30a of the sheet heater 30 and positioned at different levels, The first electrode region A1 is divided into a large number of zones Z1 (for example, one hundred zones or three hundred zones). In each zone Z1, the corresponding correction heater electrode 34 is unicursally wired throughout the zone Z1 from a first end 34a to a second end 34b. In FIG. 2, dotted virtual lines are drawn over the first electrode region A1 and port ions defined by the virtual lines are regarded as the zones Z1. For convenience, FIG. 2 illustrates the correction heater electrode 34 in only one zone Z1. However, the correction heater electrodes 34 are similarly disposed in the other zones Z1. The contour of the sheet heater 30 is drawn with dot-and-dash lines.

Jumper wires 36 that individually teed electricity to the respective correction heater electrodes 34 are disposed in the second electrode region A2. The number of the jumper wires 36 thus coincides with the number of the correction heater electrodes 34. The second electrode region A2 is divided into zones Z2, the number of which is smaller than the number of zones Z1 (for example, six zones or eight zones). In FIG. 2, dotted virtual lines are drawn over the second electrode region A2 and portions defined by the virtual lines are regarded as the zones Z2. For convenience, FIG. 2 illustrates (some of) the jumper wires 36 in only one zone Z2. However, the jumper wires 36 are similarly disposed in the other zones Z2. In the present embodiment, multiple correction heater electrodes 34 that fall within a projected area, a projection of one zone Z2 onto the first electrode region A1, are described as belonging to the same group. Each of the first ends 34a of the correction heater electrodes 34 that belong to one group is connected to a first end 36a of the corresponding one of the jumper wires 36 in the zone 22 corresponding to the group with a via hole 35 (see FIG. 1) interposed therebetween, the via hole 35 vertically extending between the first electrode region A1 and the second electrode region A2. A second end 36b of each jumper wire 36 is drawn to a peripheral portion 38 in the zone Z2. Thus, the second ends 36b of the jumper wires 36 connected to the correction heater electrodes 34 that belong to the same group are collectively disposed in the single peripheral portion 38. Jumper lands 46a, connected to the second ends 36b of the jumper wires 36 with a via hole 41 (see FIG. 1) interposed therebetween, are arranged in an area X, which corresponds to a projection of the peripheral portion 38 onto the lower surface 30b of the sheet heater 30. In other words, two or more jumper lands 46a are disposed in a lot in the same area X so as to be exposed to the outside. Preferably, the specific electric resistance of the correction heater electrodes 34 is higher than or equal to the specific electric resistance of the jumper wires 36.

In the third electrode region A3, a ground electrode 40, common to the multiple correction heater electrodes 34, is disposed. The correction heater electrodes 34 are connected to the ground electrode 40 with via holes 42 (see FIG. 1) interposed therebetween, the via holes 42 extending from the first electrode region A1 to the third electrode region A3 through the second electrode region A2. The ground electrode 40 includes protrusions 40a, protruding outward from the outer circumference. The protrusions 40a are disposed so as to face cutouts 39 in the peripheral portions 38. The protrusions 40a are connected to ground lands 46b on the lower surface 30b of the sheet heater 30 with via holes 43 (see FIG. 1) interposed therebetween. The ground lands 46b are disposed in the areas X of the lower surface 30b of the sheet heater 30 together with the jumper lands 46a.

The fourth electrode region A4 is divided into zones Z4, the number of which is smaller than the number of correction heater electrodes 34 disposed in the first electrode region A1 (such as four zones or six zones). In each zone Z4, a reference heater electrode 44 producing a higher output than the correction heater electrodes 34 is unicursally wired throughout the zone Z4 from a first end 44a to a second end 44b. In FIG. 2, dotted virtual lines are drawn over the fourth electrode region A4 and portions defined by the virtual lines are regarded as the zones Z4. For convenience, FIG. 2 illustrates the reference heater electrode 44 in only one zone Z4. However, reference heater electrodes 44 are similarly disposed in the other zones Z4. Both ends 44a and 44b of each reference heater electrode 44 are connected to a pair of reference lands 50a and 50b on the lower surface 30b of the sheet heater 30 with via holes, not illustrated, interposed therebetween, the via holes extending from the fourth electrode region A4 to the lower surface 30b of the sheet heater 30.

As illustrated in FIG. 1, the support pedestal 60 is a disc-shaped member made of a metal such as A1 or an A1 alloy and in which a refrigerant path 62 is disposed. A chiller 70, which regulates the temperature of a refrigerant, is connected to an inlet port 62a and an outlet port 62b of the refrigerant path 62. When fed from the chiller 70 to the inlet port 62a of the refrigerant path 62, the refrigerant flows through the refrigerant path 62, extending throughout the support pedestal 60, returns to the chiller 70 from the outlet port 62b of the refrigerant path 62, is cooled to a predetermined temperature inside the chiller 70, and is then fed to the inlet port 62a of the refrigerant path 62 again. The support pedestal 60 has multiple types of through holes 64 to 67, which vertically extend through the support pedestal 60. The through hole 64 is a hole that allows a power-feed terminal 25 of the electrostatic electrode 24 to be exposed to the outside. Each through hole 65 is a hole that allows a land group (jumper lands 46a and ground lands 46b, see FIG. 2) in the corresponding area X of the lover surface 30b of the sheet heater 30 to be exposed to the outside. Through holes 66 and 67 are holes that, respectively allow the reference lands 50a and 50b connected to the reference heater electrode 44 to be exposed to the outside. Electrical insulating tubes 66a and 67a are inserted into the through holes 66 and 67. Although not illustrated, the support pedestal 60 also includes a through hole that allows a lift pin to move vertically therethrough so that the lift pin lifts the wafer W up.

The plasma processor 10 also includes an electrostatic chuck power source 72, a correction heater power source 74, a reference heater power source 76, and a RF power source 79. The electrostatic chuck power source 72 is a DC power source. The electrostatic chuck power source 72 is connected to the power-feed terminal 25 of the electrostatic electrode 24 using a feeding rod 73 inserted into the through hole 64. The correction heater power source 74 is a DC power source. The correction heater power source 74 is connected to the jumper lands 46a and the ground lands 46b corresponding to the correction heater electrodes 34 using connection flexible printed boards (connection FPCs) 75, each being a metal wire assembly inserted into the corresponding through hole 65. Specifically, the jumper lands 46a and the ground land 46b belonging to the same group in FIG. 2 are arranged in the same area X and thus are connected together using a single connection FPC 75. Each connection FPC 75 is a cable, a bundle of metal wires 75a and 75b covered with resin coating. The metal wires 75a and 75b are exposed from an end portion of each connection FPC 75 facing the area X. The metal wires 75a are wires that connect the jumper lands 46a to a positive pole of the correction heater power source 74 and the metal wires 75b are wires that connect the ground lands 46b to a negative pole of the correction heater power source 74. The reference heater power source 76 is an AC power source. The reference heater power source 76 is connected to the reference land 50a, connected to the reference heater electrode 44, using a cable terminal 77 inserted into the through hole 66 and is connected to the reference land 50b, connected to the reference heater electrode 44, using a cable terminal 78 inserted into the through hole 67. The RF power source 79 is a power source for producing plasma. The RF power source 79 is connected to the support pedestal 60, functioning as an anode plate, to feed high frequency power to the support pedestal 60. The showerhead 14, functioning as a cathode plate, is grounded with a variable resistance interposed therebetween.

Figure 3A:
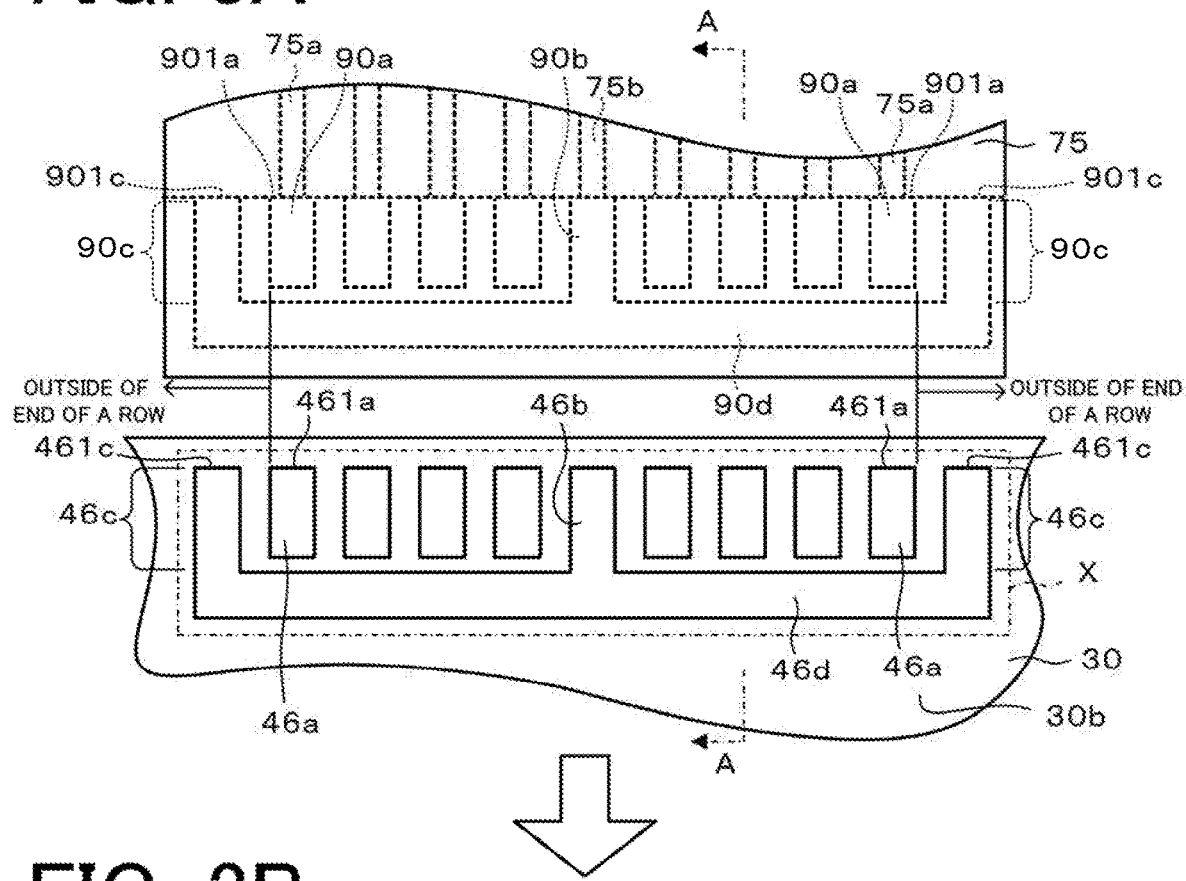
FIGS. 3A and 3B illustrate processes of manufacturing an integrated wiring board assembly 100.
Figure 3B:
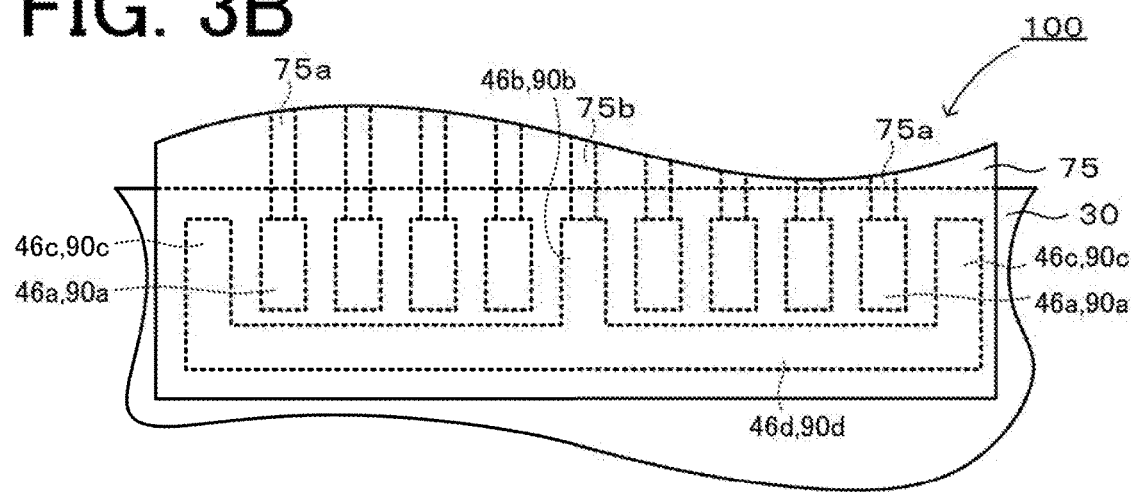
Figure 4:
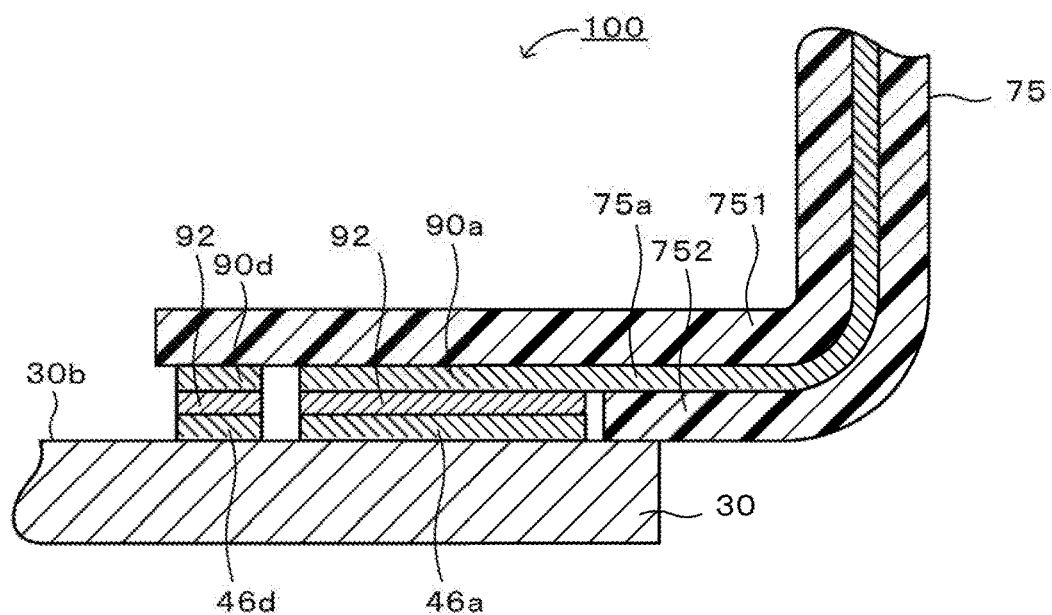
FIG. 4 is a sectional view of a portion, taken along line A-A of FIG. 3A.

Now, an integrated wiring board assembly 100 in which the sheet heater 30 and the connection FPC 75 are joined together is described with reference to FIG. 3 and FIG. 4. FIG. 3 illustrate processes for manufacturing the integrated wiring board assembly 100, where FIG. 3A illustrates the state before joining and FIG. 3B illustrates the state after joining. FIG. 4 is a sectional view of the portion taken along line A-A of FIG. 3A.

Each connection FPC 75 is a flat wiring member including multiple metal wires 75a and 75b coated with resin.

Specifically, as illustrated in FIG. 4, the connection FPC 75 includes multiple metal wires 75a and 75b between a resin support layer 751 and a resin coat layer 752. Jumper contact points 90a, serving as end portions of the metal wires 75a, and a ground contact point 90b, serving as an end portion of the metal wire 75b, are rectangular electrodes and exposed from the coat layer 752. A connection electrode 90d is also exposed from the coat layer 752. The jumper contact points 90a and the ground contact point 90b are. arranged in a row along the short side of the connection FPC 75. The ground contact point 90b is positioned at substantially the middle of this row and connected to the connection electrode 90d, extending along the row. The connection electrode 90d extends beyond both ends of this row and is exposed from the coat layer 752. The connection electrode 90d has bent portions 90c, bent so as to surround the two jumper contact points 90a at both ends of this row. An end 901c of each bent portion 90c extends to ends 901a of the jumper contact points 90a. Each bent portion 90c has a larger area than the adjacent jumper contact point 90a. Multiple jumper contact points 90a are interposed between the ground contact point 90b and the bent portion 90c.

The sheet heater 30 includes jumper lands 46a, ground lands 46b, and connection lands 46d. Each jumper land 46a has substantially the same shape as each jumper contact point 90a. Each ground land 46b has substantially the same shape as each ground contact point 90b. Each connection land 46d has substantially the same shape as each connection electrode 90d. These lands 46a, 46b, and 46d are exposed to the outside in the area X of the lower surface 30b of the sheet heater 30. The jumper lands 46a and the ground land 46b are arranged in a row in the longitudinal direction of the area X. The ground land 46b is positioned at substantially the middle of the row and connected to the connection land 46d extending along this row. The connection land 46d extends beyond both ends of this row. The connection land 46d has bend portions 46c, bent so as to surround the two jumper lands 46a at both ends of this row. Ends 461c of the bent portions 46c extend to points aligned with ends 461a of the jumper lands 46a, Each bent portion 46c has a larger area than the adjacent jumper land 46a. Multiple jumper lands 46a are interposed between the ground land 46b and each bent portion 46c.

Each connection FPC 75 and the sheet heater 30 are joined together by a solder joint member 92. Specifically, in the state where the jumper contact points 90a and the jumper lands 46a face one another, the ground contact point 90b and the ground land 46b face one another, and the connection electrode 90d including the bent portions 90c and the connection land 46d including the bent portions 46c face one another, they are soldered to one another to form an integrated wiring board assembly 100.

Now, an example of use of the plasma processor 10 having this structure is described. First, a wafer W is placed on the wafer mount surface 22a of the electrostatic chuck 22. Then, the pressure inside the vacuum chamber 12 is reduced by a vacuum pump to a predetermined degree of vacuum, a DC voltage is applied to the electrostatic electrode 24 of the electrostatic chuck 22 to cause the Coulomb force or the Johnson-Rahbek effect, so that the wafer W is attracted to and fixed to the wafer mount surface 22a of the electrostatic chuck 22. Subsequently, the inside of the vacuum chamber 12 is changed into a process gas atmosphere having a predetermined pressure (for example, several ten to several hundred pascals). In this state, a high frequency voltage is applied across the showerhead 14 and the support pedestal 60 to produce plasma. The produced plasma etches the surface of the wafer W. During the etching, a controller, not illustrated, controls the temperature of the wafer W so that the wafer W has a predetermined intended temperature. Specifically, the controller receives detection signals from a thermal sensor, which is not illustrated and determines the temperature of the wafer W, and controls the current fed to each reference heater electrode 44, the current fed to each correction heater electrode 34, and the temperature of the refrigerant flowing through the refrigerant path 62 so that the determined temperature of the wafer W coincides with, the intended temperature. The controller particularly finely controls the current fed to each correction heater electrode 34 so that the wafer W does not have temperature distribution. The thermal sensor may be buried in the resin sheet 32 or bonded to the surface of the resin sheet 32.

Here, correspondence between components of the present embodiment and components of the present invention is clarified. The connection FPC 75 according to the present embodiment corresponds to a first wiring board of the present invention. The sheet heater 30 corresponds to a second wiring board and each solder joint member 92 corresponds to a joint member. The jumper contact points 90a and the ground contact points 90b of each connection FPC 75 correspond to first contact points. The bent portions 90c of each connection FPC 75 correspond to first bent portions. The connection electrode 90d of each connection FPC 75 corresponds to a first connection electrode. The jumper lands 46a and the ground lands 46b of the sheet heater 30 correspond to second contact points. The bent portions 46c of the sheet heater 30 correspond to second bent portions. Each connection land 46d of the sheet heater 30 corresponds to a second connection electrode.

In the above-described integrated wiring board assembly 100, each connection land 46d and the corresponding connection electrode 90d are brazed or soldered. Thus, the connection FPC 75 joined to the sheet heater 30 has higher bonding strength. Even if the periphery of the connection FPC 75 curls up, electrical connection between the sheet heater 30 and the connection FPC 75 is more likely to be maintained. The bent portions 90c on both sides of the connection FPC 75 reduce the effect of the external force on the jumper contact points 90a and the ground contact point 90b between the bent portions 90c. The bent portions 46c on both sides on the sheet heater 30 reduce the effect of the external force on the jumper lands 46a and the ground land 46b between the bent portions 46c. Also from this point of view, electrical connection between the sheet heater 30 and the connection FPC 75 is more likely to be maintained.

Each connection land 46d includes the bent portions 46c, bent so as to surround the two jumper lands 46a at both ends of the row. The bent, portions 46c extend to points aligned with the ends 461a of the jumper lands 46a. Each connection electrode 90d includes the bent portions 90c, bent so as to surround the two jumper contact points 90a at both ends of the row. The bent portions 90c extend to points aligned with the ends 901a of the jumper contact points 90a. Thus, the above-described effects are significantly exerted.

Each ground contact point 90b connected to the connection electrode 90d of the corresponding connection FPC 75 can be regarded as a single large contact point. Each ground land 46b connected to the corresponding connection land 46d of the sheet heater 30 can also be regarded as a single large contact point. A relatively strong current flows at contact points for grounding and the junction between the contact points is thus likely to produce heat. In the present embodiment, however, heat produced at the junction can be reduced by using the large contact points as contact points for grounding.

Each bent portion 46c has a larger area than the adjacent jumper land 46a. Each bent portion 90c has a larger area than the adjacent jumper contact point 90a. Thus, the bonding strength between each bent portion 46c and the corresponding bent portion 90c is enhanced.

The present invention is not limited to the above-described embodiment and may naturally be embodied in various different types of embodiments as long as they belong to the technical scope of the present invention.

Figure 5A:
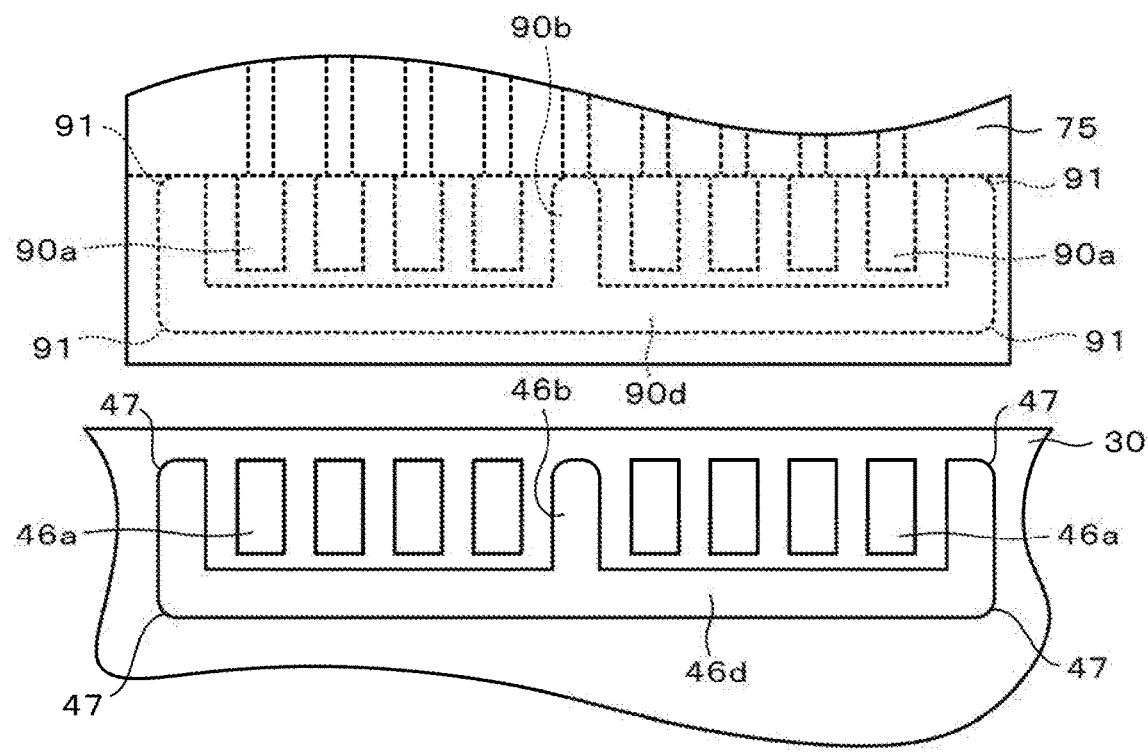
FIGS. 5A and 5B illustrate processes of manufacturing a modification example of the integrated wiring board assembly 100.
Figure 5A:
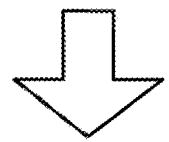
Figure 5B:
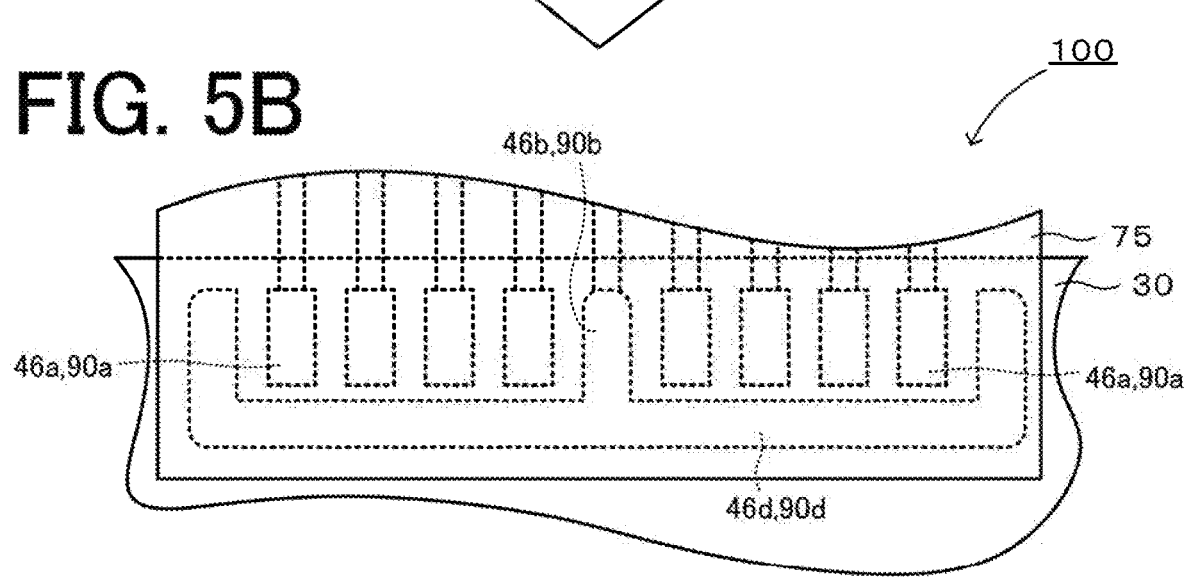

For example, in the integrated wiring board assembly 100 according to the above-described embodiment, as illustrated in FIG. 5, outer corner portions 91 of the connection electrode 90d of each connection FPC 75 may have a rounded shape, such as an arc or an ellipse arc and outer corner portions 47 of each connection land 46d of the sheet heater 30 may have the same rounded shape. This structure disperses a stress, even when an external force is exerted on the connection electrode 90d and the connection land 46d, since these outer corner portions 91 and 47 are rounded. Thus, electrical connection between the connection electrode 90d and the connection land 46d is more likely to be maintained. Corner portions of each jumper contact point. 90a, corner portions of each ground contact point 90b, corner portions of each jumper land 46a, and corner portions of each ground land 46b may also be rounded.

Figure 6A:
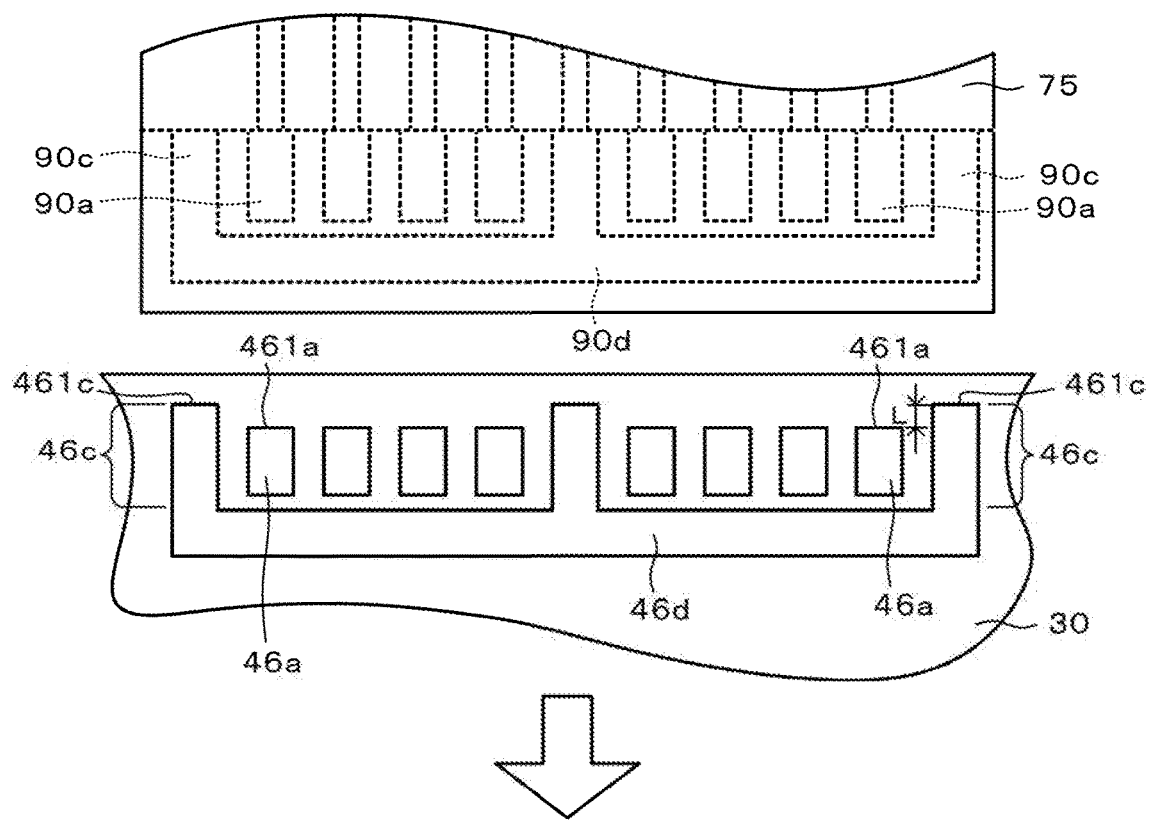
FIGS. 6A and 6B illustrate processes of manufacturing a modification example of the integrated wiring board assembly 100.
Figure 6B:
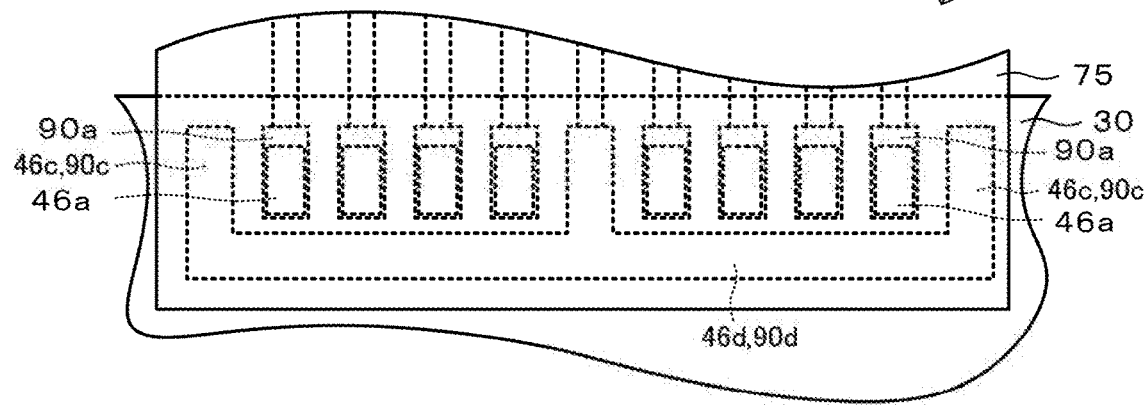

In the integrated wiring board assembly 100 according to the above-described embodiment, as illustrated in FIG. 6, the ends 461c of the bent portions 46c of the sheet heater 30 may extend beyond the points aligned with the ends 461a of the jumper lands 46a. Here, each jumper land 46a is shortened by a length L compared to the above-described structure so that the ends 461c of the bent portions 46c extend beyond the points aligned with the ends 461a of the jumper lands 46a. This structure further reduces the effect of the external force on the junction between each jumper land 46a of the sheet heater 30 and the jumper contact point 90a of the corresponding connection FPC 75.

Figure 7A:
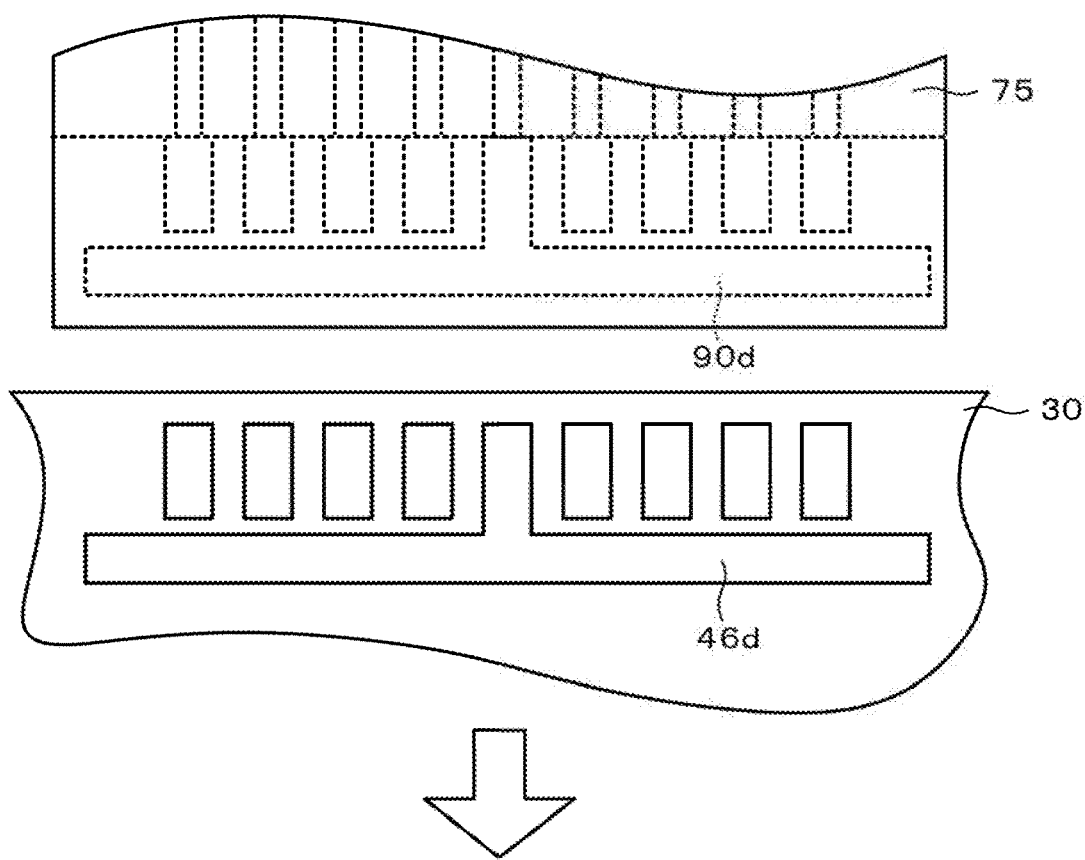
FIGS. 7A and 7B illustrate processes of manufacturing a modification example of the integrated wiring board assembly 100.
Figure 7B:
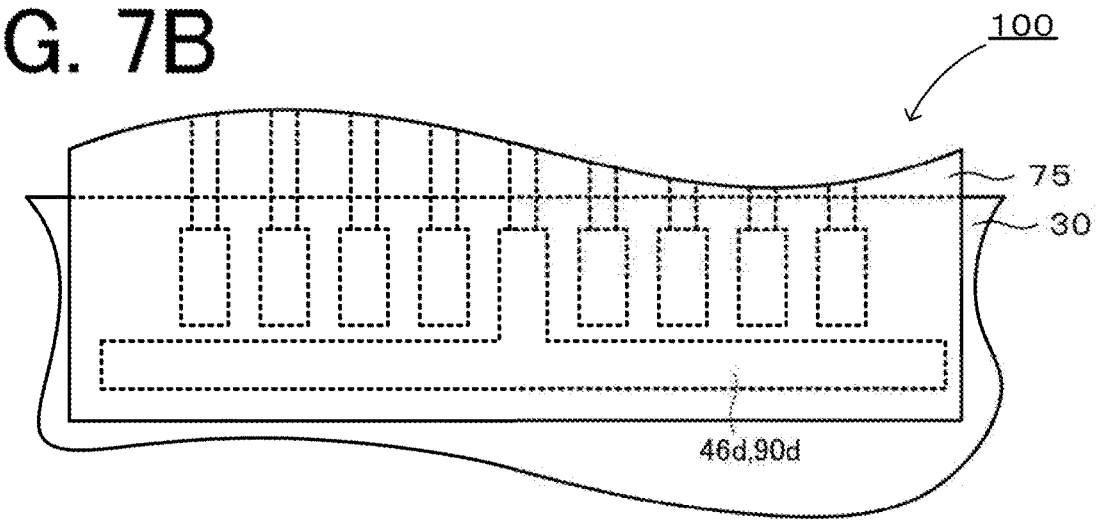

In the integrated wiring board assembly 100 according to the above-described embodiment, as illustrated in FIG. 7, the connection electrode 90d of each connection FPC 75 may be formed straight without having the bent portions 90c and each connection land 46d of the sheet heater 30 may also be formed straight without having the bent portions 46c. Even in this case, the connection FPC 75 joined to the sheet heater 30 has higher bonding strength since the connection electrode 90d and the connection land 46d are brazed or soldered. Even when the periphery of the connection FPC 75 curls up away from the sheet heater 30, electrical connection between the connection FPC 75 and the sheet heater 30 is more likely o be maintained.

Figure 8A:
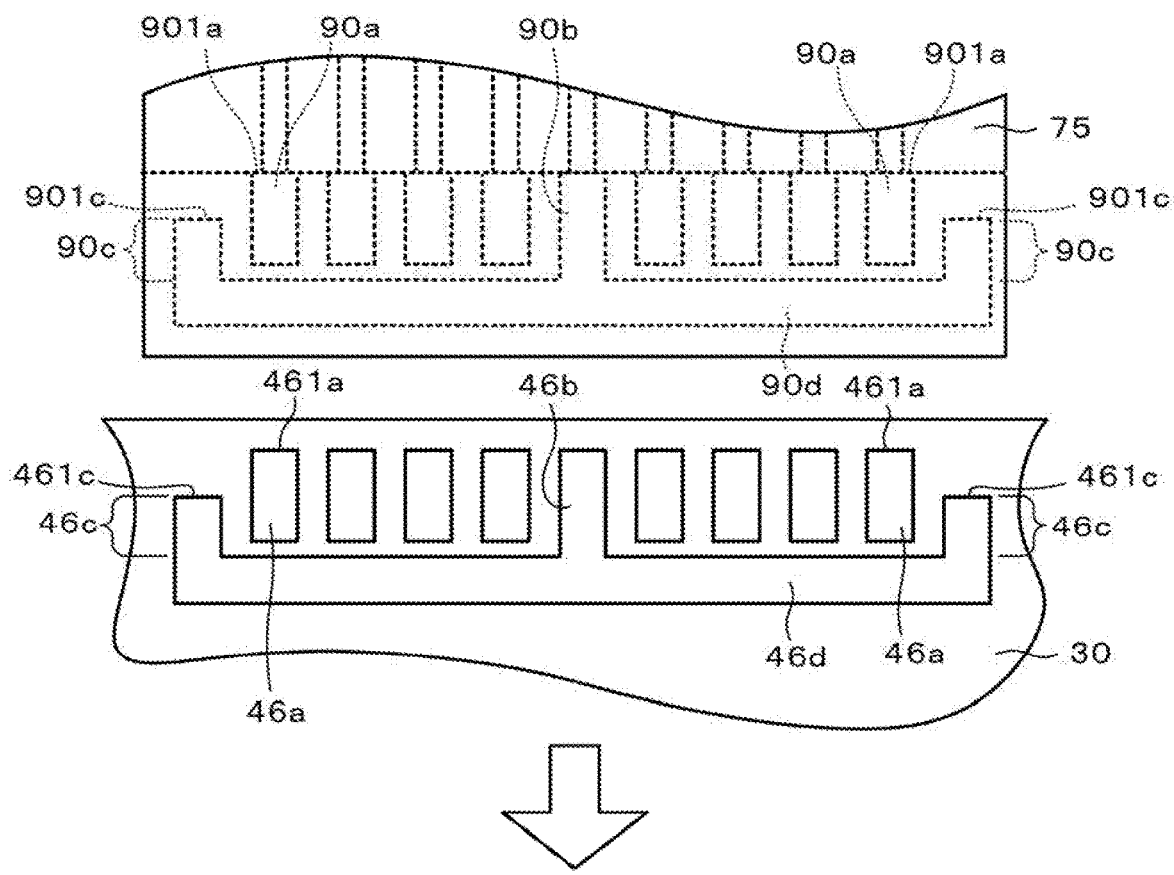
FIGS. 8A and 8B illustrate processes of manufacturing a modification example of the integrated wiring board assembly 100.
Figure 8B:
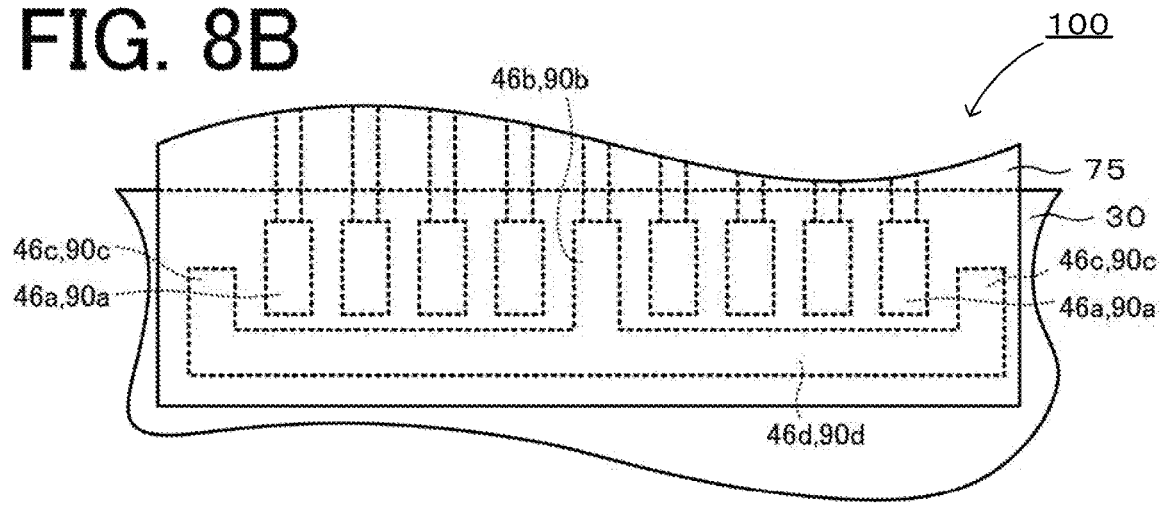
Figure 9:
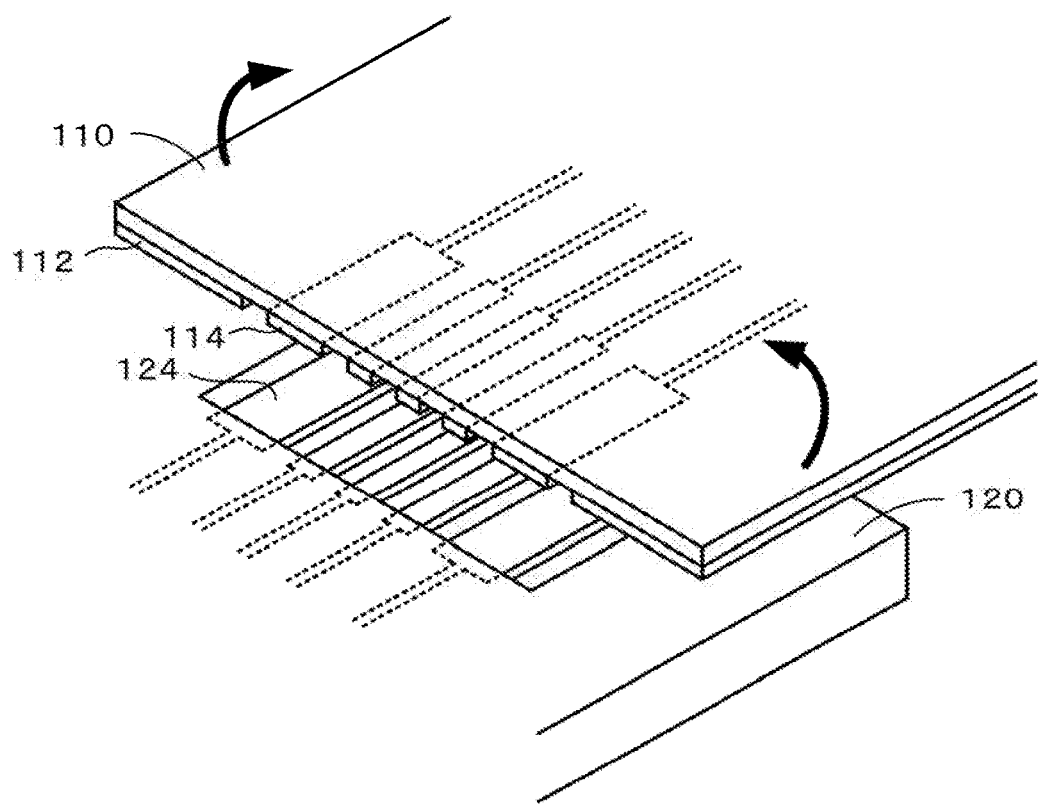
FIG. 9 is a perspective view of an existing integrated wiring board assembly.

In the integrated wiring board assembly 100 according to the above-described embodiment, as illustrated in FIG. 8, the ends 901c of the bent portions 90c of each connection FPC 75' may extend short of points aligned with the ends 901a of the jumper contact points 90a and the ends 461c of the bent portions 46c of the sheet heater 30 may extend short of points aligned with the ends 461a of the jumper lands 46a. Even in this case, the connection FPC 75 joined to the sheet heater 30 has higher bonding strength since each connection electrode 90a having the bent portions 90c and the corresponding connection land 46d having the bent portions 46c are brazed or soldered. Even when the periphery of the connection FPC 75 curls up away from the sheet heater 30, electrical connection between the connection FPC 75 and the sheet heater 30 is more likely to be maintained. Although the structure illustrated in FIG. 8 can more reliably obtain such effects than the structure illustrated in FIG. 7, the above-described embodiment (see FIG. 3) can more reliably obtain such effects than the structure illustrated in FIG. 8.

In the above-described embodiment, each connection FPC 75 is described as an example of a first wiring board and the sheet heater 30 is described as an example of a second wiring board. However, this is not the only possible combination. For example, a flat cable may be used sis a first wiring board and a printed circuit board may be used as a second wiring board.

In the above-described embodiment, each ground contact point 90b is positioned substantially the middle of the row of contact points (a row in which the jumper contact points 90a and the ground contact point 90b are arranged). However, the ground contact point 90b may be positioned at any point of the row. Nevertheless, the ground contact point 90b is preferably positioned at a point other than both ends of the row so as not to be detached due to detachment of the connection electrode 90d. Specifically, the jumper contact points 90a are preferably disposed at both ends of the row.

The present application claims priority from Japanese Patent Application No. 2016-137472, filed on Jul. 12, 2016, the entire contents of which are incorporated herein by reference.

What is claimed is:

1. An integrated wiring board assembly, comprising:
    a first wiring board including a plurality of first contact points, exposed to an outside and arranged in a row in a predetermined direction, and a first connection electrode, extending along the row and to which one of the plurality of first contact points is connected, the first connection electrode extending beyond both ends of the row;
    a second wiring board of a type the same as or different from a type of the first wiring board, the second wiring board including a plurality of second contact points, exposed to the outside and arranged in a row in the predetermined direction, and a second connection electrode, extending along the row and to which one of the plurality of second contact points is connected, the second connection electrode extending beyond both ends of the row; and
    a joint member with which the first contact points of the first wiring board and the second contact points of the second wiring board are brazed or soldered while the first contact points and the second contact points face one another and with which the first connection electrode of the first wiring board and the second connection electrode of the second wiring board are brazed or soldered while the first connection electrode and the second connection electrode face each other.

2. The integrated wiring board assembly according to claim 1,
    wherein the first connection electrode includes first bent portions bent so as to surround two of the first contact points at both ends of the row, and
    the second connection electrode includes second bent portions bent so as to surround two of the second contact points at both ends of the row.

3. The integrated wiring board assembly according to claim 2,
    wherein the first bent portions extend to points aligned with ends of the first contact points at both ends of the row, and the second bent portions extend to points aligned with ends of the second contact points at both ends of the row.

4. The integrated wiring board assembly according to claim 3,
wherein the second bent portions extend beyond the points aligned with the ends of the second contact points at both ends of the row.

5. The integrated wiring board assembly according to claim 2,
wherein each of the first bent portions has a larger area than a first contact point adjacent to the first bent portion, and
each of the second bent portions has a larger area than a second contact point adjacent to the second bent portion.

6. The integrated wiring board assembly according to claim 1,
wherein the first contact point connected to the first connection electrode and the second contact point connected to the second connection electrode serve as contact points of a circuit through which a strong current flows.

7. The integrated wiring board assembly according to claim 1,
wherein an outer corner portion of the first connection electrode and an outer corner portion of the second connection electrode are rounded.

8. The integrated wiring board assembly according to claim 1,
wherein the first wiring board is a flexible printed board, and
the second wiring board is a sheet heater and is disposed between an electrostatic chuck and a metal support pedestal.

* * * * *